(12) United States Patent
Suzuki et al.

(10) Patent No.: US 7,679,143 B2
(45) Date of Patent: Mar. 16, 2010

(54) SEMICONDUCTOR DEVICE HAVING MOS TRANSISTOR AND PROTECTION DIODE AND METHOD FOR DESIGNING THE SAME

(75) Inventors: Naohiro Suzuki, Anjo (JP); Hitoshi Yamaguchi, Nisshin (JP)

(73) Assignee: DENSO CORPORATION, Kariya (JP)

( * ) Notice: Subject to any disclaimer, the term of this patent is extended or adjusted under 35 U.S.C. 154(b) by 706 days.

(21) Appl. No.: 11/415,228

(22) Filed: May 2, 2006

(65) Prior Publication Data

US 2006/0255411 A1 Nov. 16, 2006

(30) Foreign Application Priority Data

May 11, 2005 (JP) .............................. 2005-139105

(51) Int. Cl.
*H01L 23/62* (2006.01)
(52) U.S. Cl. ............... 257/355; 257/360; 257/E29.256; 438/237
(58) Field of Classification Search ......... 257/355–363, 257/E29.256; 438/237
See application file for complete search history.

(56) References Cited

U.S. PATENT DOCUMENTS 6,831,331 B2   12/2004   Kitamura et al.

FOREIGN PATENT DOCUMENTS

JP          11-163275          6/1999

OTHER PUBLICATIONS

Ruzyllo, Silicon-On-Insulator, Jun. 20, 2003, Penn State University.*

* cited by examiner

*Primary Examiner*—Kiesha R Bryant
*Assistant Examiner*—Tucker Wright
(74) *Attorney, Agent, or Firm*—Posz Law Group, PLC

(57) ABSTRACT

A semiconductor device includes: a MOS transistor; a protection diode; and a semiconductor substrate. The MOS transistor and the protection diode are disposed in the semiconductor substrate. The drain of the MOS transistor is connected to the cathode of the protection diode. The source of the MOS transistor is connected to the anode of the protection diode. The MOS transistor has a withstand voltage defined as $V_T$. The protection diode has a withstand voltage defined as $V_D$, a parasitic resistance defined as $R_D$, and a maximum current defined as $I_{Rmax}$. They satisfy a relationship of $V_T > V_D + I_{Rmax} \times R_D$. The maximum current of $I_{Rmax}$ is equal to or larger than 45 Amperes.

4 Claims, 8 Drawing Sheets

US 7,679,143 B2

SEMICONDUCTOR DEVICE HAVING MOS TRANSISTOR AND PROTECTION DIODE AND METHOD FOR DESIGNING THE SAME

CROSS REFERENCE TO RELATED APPLICATION

This application is based on Japanese Patent Application No. 2005-139105 filed on May 11, 2005, the disclosure of which is incorporated herein by reference.

FIELD OF THE INVENTION

The present invention relates to a semiconductor device and a method for designing a semiconductor device.

BACKGROUND OF THE INVENTION

A semiconductor device having a MOS transistor and a protection diode, which are formed on a semiconductor substrate, is disclosed in, for example, EP 0905781, which corresponds to JP H11-163275. The MOS transistor is, for example, a lateral type MOS transistor, specifically, a lateral double-diffused MOS transistor (i.e., LDMOS transistor). The protection diode protects the LDMOS from an electro static discharge (i.e., ESD) or the like. In the device having the protection diode, in general, a drain of the MOS transistor is connected to a cathode of the protection diode. Further, a source of the MOS transistor is connected to an anode of the protection diode.

The withstand voltage of the MOS transistor is about 70V, for example. Further, the withstand voltage of the protection diode is about 55V, for example. Accordingly, in the device, the withstand voltage of the MOS transistor is higher than that of the protection diode by about 15V. Here, all surge current cannot be absorbed in the protection diode when the ESD is occurred.

The maximum current flows through the device, i.e., the protection diode, at a moment when the ESD is occurred. The protection diode shows a positive linear resistance characteristic after the diode is broken down. Specifically, as the current increases, the voltage of the diode also increases. This resistance region higher than 55V is attribute to a parasitic resistor in the protection diode.

When the maximum current flows through the protection diode, a certain voltage is applied to the diode. When the certain voltage is applied to the diode, the certain voltage is also applied to the MOS transistor. This is because the protection diode is connected to the MOS transistor in parallel. Accordingly, the MOS transistor may be broken down so that the transistor shows a negative resistance region. Thus, a part of the surge current flows into the MOS transistor, so that the MOS transistor is broken down.

SUMMARY OF THE INVENTION

In view of the above-described problem, it is an object of the present invention to provide a semiconductor device having a MOS transistor and a protection diode. It is another object of the present invention to provide a method for designing a semiconductor device having a MOS transistor and a protection diode.

A semiconductor device includes: a MOS transistor having a drain and a source; a protection diode having a cathode and an anode; and a semiconductor substrate. The MOS transistor and the protection diode are disposed in the semiconductor substrate. The drain of the MOS transistor is connected to the cathode of the protection diode. The source of the MOS transistor is connected to the anode of the protection diode. The MOS transistor has a withstand voltage defined as $V_T$. The protection diode has a withstand voltage defined as $V_D$, a parasitic resistance defined as $R_D$, and a maximum current defined as $I_{Rmax}$. The withstand voltage of $V_T$ of the MOS transistor and the withstand voltage of $V_D$, the parasitic resistance of $R_D$, and the maximum current of $I_{Rmax}$ of the protection diode satisfy a relationship of $V_T > V_D + I_{Rmax} \times R_D$. The maximum current of $I_{Rmax}$ of the protection diode is equal to or larger than 45 Amperes.

In this case, the withstand voltage of the MOS transistor defined as $V_T$ is set to be higher than the sum of the withstand voltage of the diode defined as $V_D$ and the voltage increase caused by the parasitic resistance defined as $R_D$ the when the maximum current defined as $I_{Rmax}$ flows through the diode. Accordingly, even when the ESD is applied to the device and the protection diode is broken down by the surge current having the maximum current of $I_{Rmax}$, the surge current does not flow through the MOS transistor. Thus, the MOS transistor is prevented from breaking down.

A method for designing a semiconductor device is provided. The semiconductor device includes a MOS transistor having a drain and a source; a protection diode having a cathode and an anode; and a semiconductor substrate. The MOS transistor and the protection diode are disposed in the semiconductor substrate. The drain of the MOS transistor is connected to the cathode of the protection diode. The source of the MOS transistor is connected to the anode of the protection diode. The method comprising the step of: setting a withstand voltage of the MOS transistor and a withstand voltage, a parasitic resistance and a maximum current of the protection diode to satisfy a relationship of $V_T > V_D + I_{Rmax} \times R_D$. The withstand voltage of the MOS transistor is defined as $V_T$. The withstand voltage of the protection diode is defined as $V_D$, the parasitic resistance of the protection diode is defined as $R_D$, and the maximum current of the protection diode is defined as $I_{Rmax}$.

In this case, the withstand voltage of the MOS transistor defined as $V_T$ is set to be higher than the sum of the withstand voltage of the diode defined as $V_D$ and the voltage increase caused by the parasitic resistance defined as $R_D$ the when the maximum current defined as $I_{Rmax}$ flows through the diode. Accordingly, even when the ESD is applied to the device and the protection diode is broken down by the surge current having the maximum current of $I_{Rmax}$, the surge current does not flow through the MOS transistor. Thus, the MOS transistor is prevented from breaking down.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The inventors have preliminarily studied about a semiconductor device having a MOS transistor and a protection diode as a comparison of an embodiment of the present invention.

Figure 7:
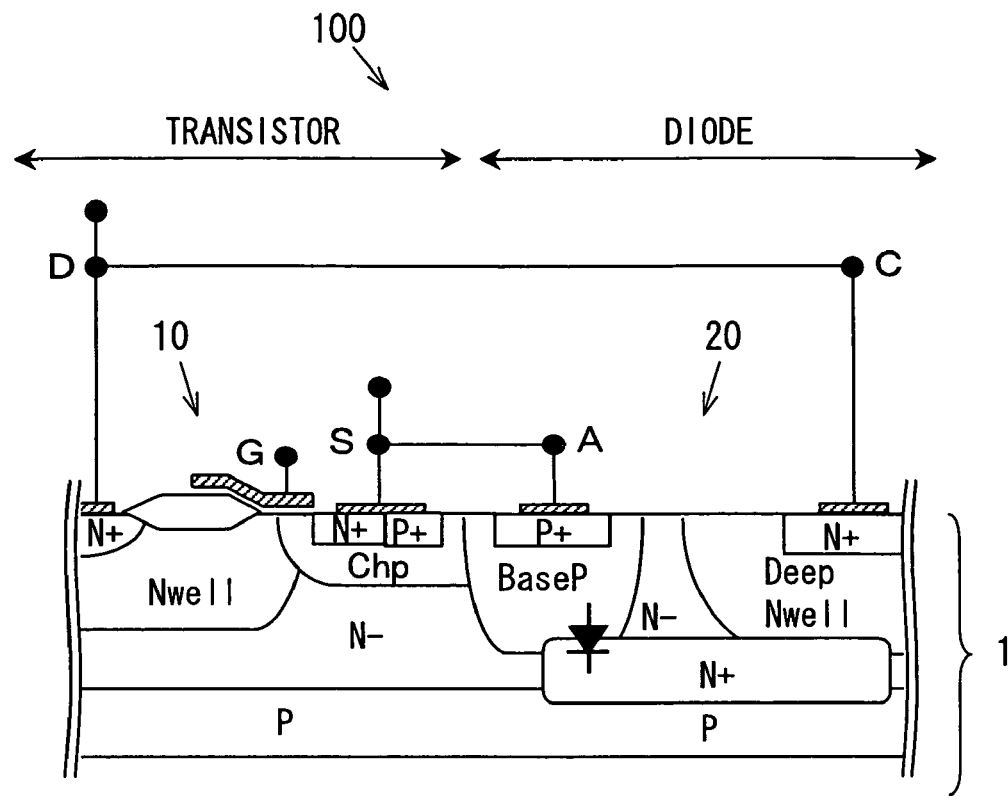
FIG. 7 is a cross sectional view showing a semiconductor device according to a comparison of the embodiment of the present invention.

FIG. 7 shows the semiconductor device 100 having the MOS transistor 10 as a semiconductor integrated circuit and the protection diode 20. The MOS transistor 10 and the protection diode 20 are formed on the semiconductor substrate 1. The MOS transistor 10 is a lateral type MOS transistor, specifically, a lateral double-diffused MOS transistor (i.e., LDMOS transistor). The protection diode 20 protects the LDMOS 10 from an electro static discharge (i.e., ESD) or the like. In the device 100 having the protection diode 20, in general, a drain D of the MOS transistor 10 is connected to a cathode C of the protection diode 20. Further, a source S of the MOS transistor 10 is connected to an anode A of the protection diode 20. Here, G in FIG. 7 represents a gate of the MOS transistor 10.

Figure 8A:
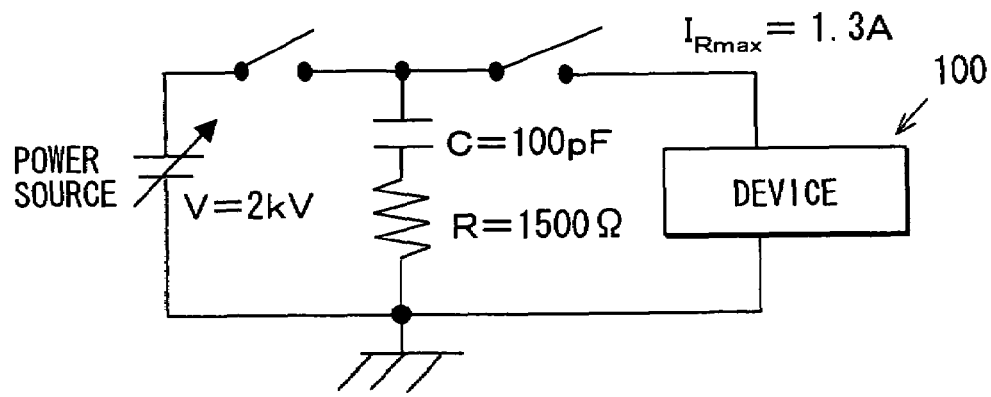
FIGS. 8A to 8C are equivalent circuit diagrams explaining electro static tests of a semiconductor device.
Figure 8B:
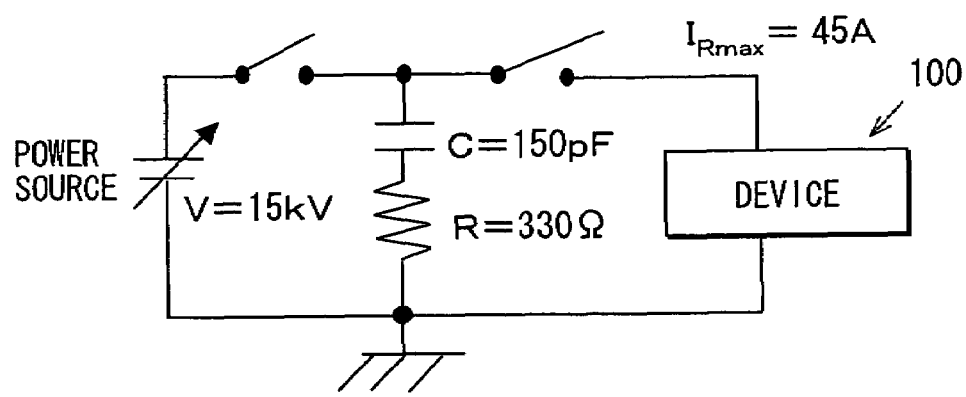
Figure 8C:
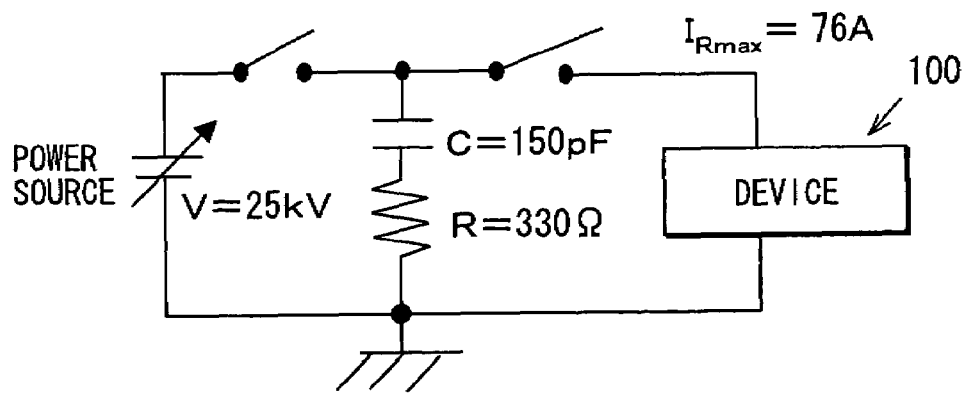

FIGS. 8A to 8C show equivalent circuits for evaluating withstand voltage of the semiconductor device 100. Each test condition in FIGS. 8A to 8C corresponds to static electrical test standards.

FIG. 8A shows a test condition of a standard for a general consumer semiconductor device. In this case, the test is performed to measure the withstand voltage when electrostatic discharge caused by contact of a human body is applied to the device. Specifically, the test condition is such that a high voltage power source has a voltage of 2 kV, a capacitor has a capacitance of 100 pF, a resistor has a resistance of 1500Ω, and a maximum current $I_{Rmax}$ is 1.3 A. Here, the maximum current $I_{Rmax}$ flows through the semiconductor device 100 as a test object at a moment when a switch is turned on. Thus, the maximum current $I_{Rmax}$ provides a maximum permissible current of the device.

FIG. 8B shows a test condition of a standard for static electricity test (i.e., IEC-1000-4-2), which is defined in International Electrotechnical Commission (i.e., IEC). Specifically, the test condition is such that a high voltage power source has a voltage of 15 kV, a capacitor has a capacitance of 150 pF, a resistor has a resistance of 330Ω, and a maximum current $I_{Rmax}$ is 45 A. Here, the maximum current $I_{Rmax}$ flows through the semiconductor device 100 as a test object at a moment when a switch is turned on.

FIG. 8C shows a test condition of a standard for an in-vehicle semiconductor device, which is mounted on an automotive vehicle. It is required for the in-vehicle semiconductor device to have higher withstand voltage against the ESD, compared with the general consumer semiconductor device. Further, the in-vehicle semiconductor device is used under a severe condition, compared with the general consumer semiconductor device. Specifically, the test condition is such that a high voltage power source has a voltage of 25 kV, a capacitor has a capacitance of 150 pF, a resistor has a resistance of 330Ω, and a maximum current $I_{Rmax}$ is 76 A. Here, the maximum current $I_{Rmax}$ flows through the semiconductor device 100 as a test object at a moment when a switch is turned on.

Figure 9:
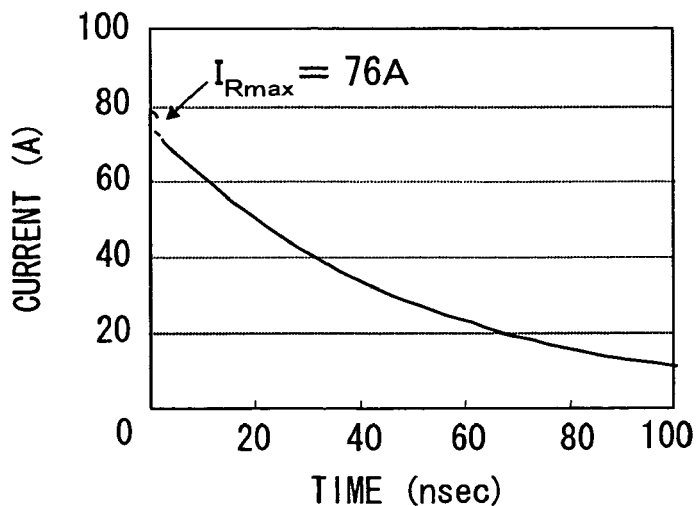
FIG. 9 is a graph showing a surge current in the semiconductor device under the electro static test shown in FIG. 8C.

FIG. 9 shows a relationship between a current flowing through the device 100 and a time. Specifically, FIG. 9 shows a surge current waveform in the device 100 when the test shown in FIG. 8C is performed.

Figure 10A:
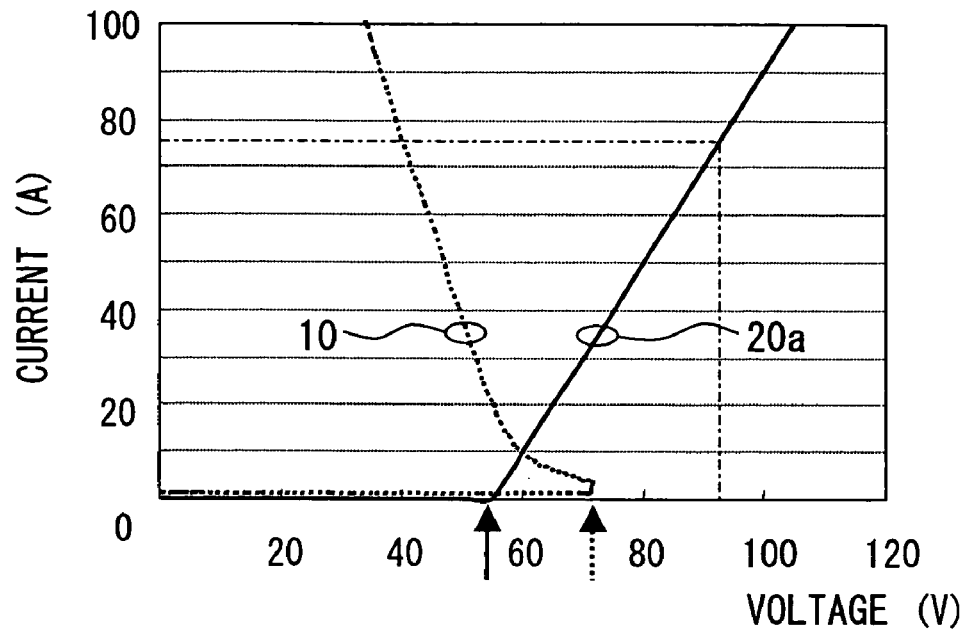
FIG. 10A is a graph showing electrical properties of a MOS transistor and a protection diode in the device under the electro static test shown in FIG. 8C.
Figure 10B:
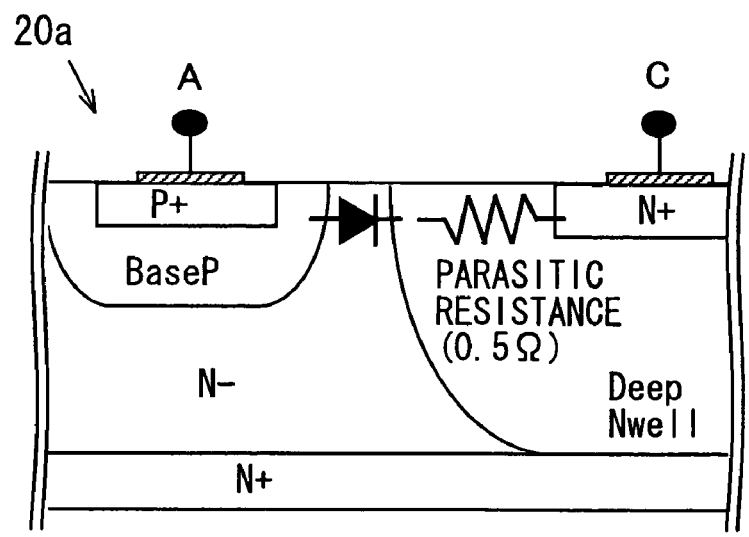
FIG. 10B is a cross sectional view showing a diode in the device.

FIG. 10A shows characteristics of the device 100 when the test shown in FIG. 8C is performed. Specifically, FIG. 10A shows a relationship between current and voltage of each of the MOS transistor 10 and a protection diode 20a. FIG. 10B shows the protection diode 20a.

In the protection diode 20a, the cathode C is connected to the drain D of the MOS transistor 10. The anode A is connected to the source S of the MOS transistor 10. Here, although FIG. 10A shows a current-voltage characteristics of the protection diode 20a, the protection diode 20 shown in FIG. 7 has the same current-voltage characteristics as FIG. 10A.

The withstand voltage of the MOS transistor 10 is about 70V, which is shown as an arrow in FIG. 10A. Further, the withstand voltage of the protection diode 20a is about 55V, which is shown as another arrow in FIG. 10A. Accordingly, in the device 100, the withstand voltage of the MOS transistor 10 is higher than that of the protection diode 20a by about 15V. However, even when if device 100 has the MOS transistor 10 and the protection diode 20a having the current-voltage characteristics shown in FIG. 10A, all surge current cannot be absorbed in the protection diode 20a when the test shown in FIG. 8C is performed.

In a case where the test shown in FIG. 8C is performed, the maximum current $I_{Rmax}$ of 76 A flows through the device 100, i.e., the protection diode 20a, at a moment when the switch is turned on. Thus, the maximum current $I_{Rmax}$ provides a maximum permissible current of the diode 20a. As shown in FIG. 10A, the protection diode 20a shows a positive linear resistance characteristic after the diode 20a is broken down. Specifically, as the current increases, the voltage of the diode 20a also increases. This resistance region higher than 55V is attribute to a parasitic resistor $R_D$ in the protection diode 20a. In FIG. 10A, the parasitic resistor $R_D$ has a parasitic resistance of 0.5Ω.

When the maximum current $I_{Rmax}$ of 76 A flows through the protection diode 20a, the voltage about 93V shown as a dashed line in FIG. 10A is applied to the diode 20a. When the voltage of 93V is applied to the diode 20a, the voltage of 93V is also applied to the MOS transistor 10. This is because the protection diode 20a is connected to the MOS transistor 10 in parallel. Accordingly, the MOS transistor 10 may be broken down so that the transistor 10 shows a negative resistance region. Thus, a part of the surge current flows into the MOS transistor 10, so that the MOS transistor 10 is broken down.

In view of the above problem, a semiconductor device according to an embodiment of the present invention is provided. Specifically, the MOS transistor is prevented from breaking down even when the ESD is occurred and the protection diode is broken down by the surge current.

Figure 1A:
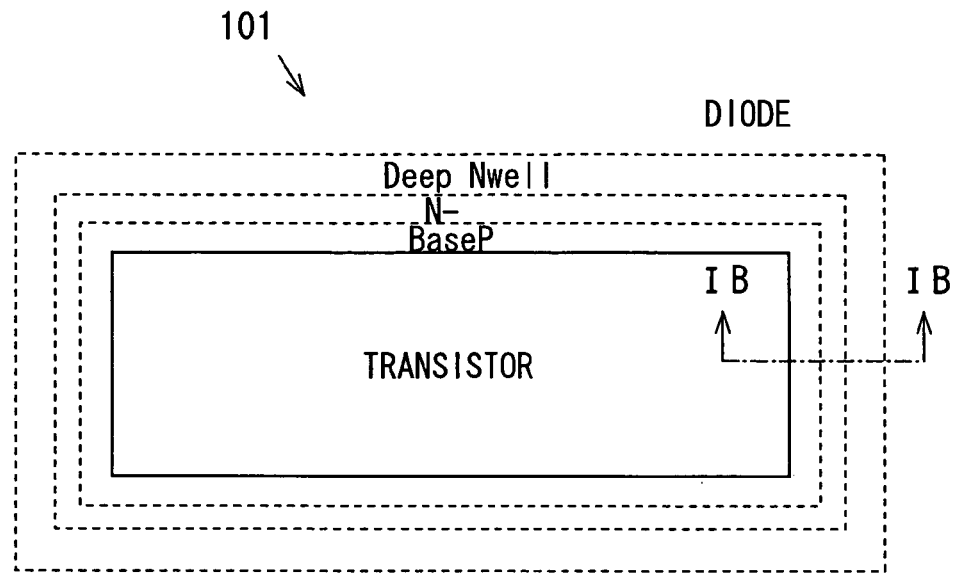
FIG. 1A is a top view showing a semiconductor device according to an embodiment of the present invention.
Figure 1B:
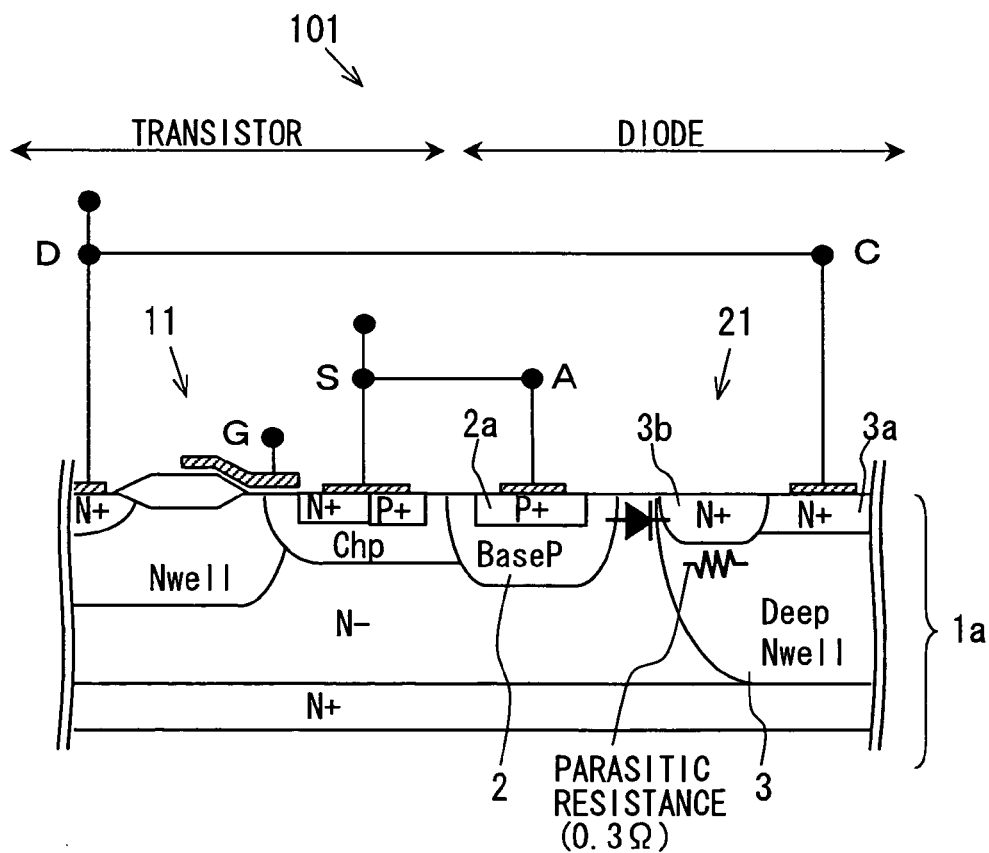
FIG. 1B is a cross sectional view showing the device taken along line IB-IB in FIG. 1A.
Figure 2:
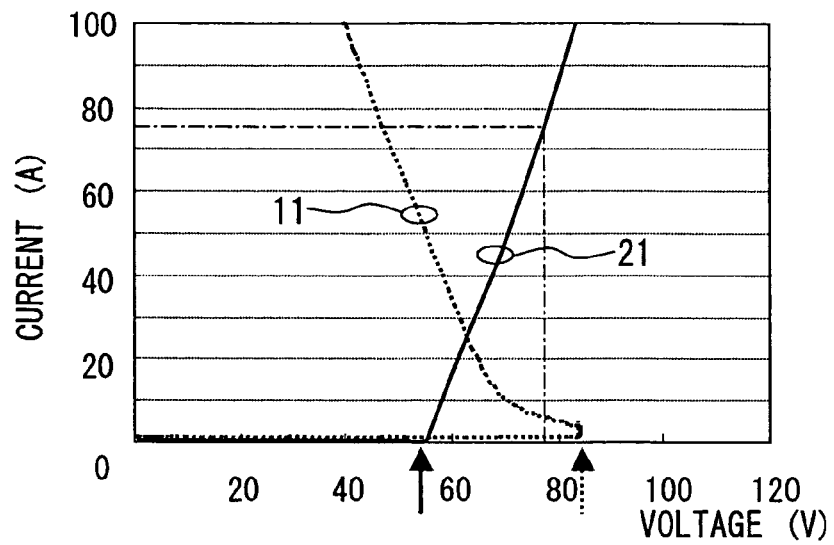
FIG. 2 is a graph showing electrical properties of a MOS transistor and a protection diode in the device under an electro static test.

FIGS. 1A and 1B show a semiconductor device 101 according to an embodiment of the present invention. FIG. 2 shows characteristics of the device 101 when the test shown in FIG. 8C is performed. Specifically, FIG. 1B shows a relationship between current and voltage of each of the MOS transistor 11 and a protection diode 21.

The semiconductor device 101 includes the MOS transistor 11 and the protection diode 21, which are formed on the semiconductor substrate 1a. The device 101 is suitably used for an automotive vehicle so that the device 101 is mounted on the vehicle. Thus, the device 101 is an in-vehicle semiconductor device. In the device 101, an diode region, in which the protection diode 21 is formed, is arranged on the substrate 1a in such a manner that the anode A of the diode 21 is disposed inside of the device 101, and the cathode C of the diode 21 is disposed outside of the device 101. Further, the diode portion surrounds the transistor portion, in which the MOS transistor 11 is formed. The transistor 11 is a lateral double diffused MOS transistor (i.e., a LDMOS transistor) so that the transistor 11 is a lateral type transistor. The protection diode 21 protects the transistor 11 from an electrostatic discharge (i.e., ESD). In the device 101 having the diode 21, in general, the drain D of the transistor 11 is connected to the cathode C of the diode 21. Further, the source S of the transistor 11 is connected to the anode A of the diode 21.

The diode 21 includes the anode A provided by a P type region 2, which is formed on a surface portion of the N⁻ type semiconductor substrate 1a. The diode 21 further includes the cathode C provided by a N type region 3, which is formed on a surface portion of the N⁻ type semiconductor substrate 1a. The N type region 3 is adjacent to the P type region 2, i.e., the anode A is disposed adjacent to the cathode C. In the P type region 2, a P⁺ type region 2a is formed. The P⁺ type region 2a contacts an electrode of the anode A. In the N type region 3, a first N⁺ type region 3a and a second N⁺ type region 3b are formed. The first N⁺ type region 3a contacts an electrode of the cathode C. The second N⁺ type region 3b is disposed between the first N⁺ type region 3a and the P type region 2. The second N⁺ type region 3b is formed to reduce a parasitic resistance in the N type region 3.

Figure 3A:
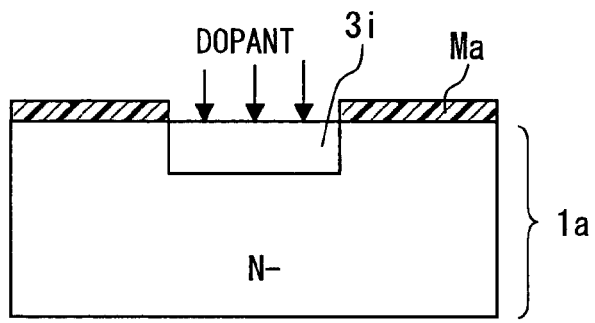
FIGS. 3A to 3C are cross sectional views showing a method for forming the protection diode in the device.
Figure 3B:
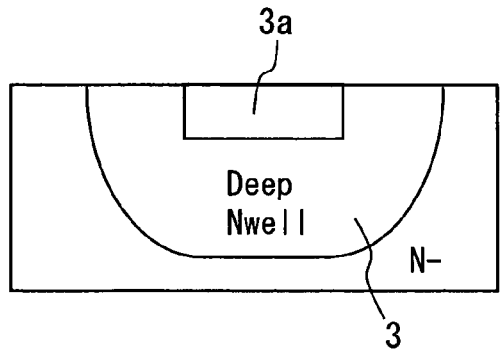
Figure 3C:
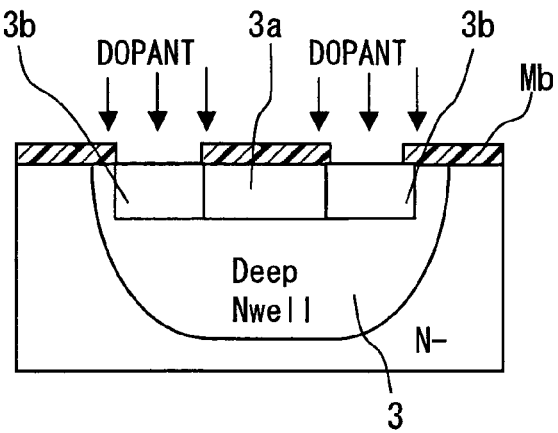

FIGS. 3A to 3C show a method for forming the first N⁺ type region 3a, the N type region 3 and the second N⁺ type region 3b, which are disposed around the cathode C of the protection diode 21. As shown in FIG. 3A, firstly, a mask Ma is formed on the N⁻ type semiconductor substrate 1a. Then, a N type impurity is implanted by an ion implantation method. Thus, an ion implantation region 3i is formed on the surface portion of the substrate 1a.

Then, the mask Ma is removed. After that, the substrate 1a is processed by a heat treatment so that the implanted impurity is diffused from the ion implantation region 3i. Thus, the N type region 3 is formed. After the heat treatment, the ion implantation region 3i provides the first N⁺ type region 3a.

The N type region 3, which is formed by the above thermal diffusion method, has large resistance since the impurity concentration of the N type region 3 is lower than that of the first N⁺ type region 3a.

As shown in FIG. 3C, another mask Mb is formed on the substrate 1. The mask Mb has an opening disposed around the first N⁺ type region 3a, and disposed on the N type region 3. Thus, the mask has no opening on the first N⁺ type region 3a. Then, a N type impurity is doped on the N type region 3 through the opening of the mask Mb. Thus, the second N⁺ type region 3b is formed in the N type region 3. After that, the thermal diffusion step of the second N⁺ type region 3b is performed. In this case, the temperature of the thermal diffusion is lower than the first thermal diffusion of the N type region 3, or the process time of the thermal diffusion is shorter than the first thermal diffusion of the N type region 3, so that the impurity in the second N⁺ type region 3b does not penetrate into the outside of the N type region 3. Specifically, the thermal diffusion conditions of the second N⁺ type region 3b are determined not to discharge the impurity in the second N⁺ type region 3b from the second N⁺ type region 3b to the outside.

By forming the second N⁺ type region 3b, the parasitic resistance of the protection diode 21 in the N type region 3 is reduced. Here, since the second N⁺ type region 3b is formed in the N type region 3, only the parasitic resistance of the protection diode 21 is reduced without reducing the withstand voltage of the protection diode 21.

The MOS transistor 11 and the protection diode 21 in the semiconductor device 101 are designed to satisfy the following conditions.

$$V_T > V_D + I_{Rmax} \times R_D \quad \text{(Formula No. 1)}$$

Here, the withstand voltage of the MOS transistor 11 is defined as $V_T$ Volts, the withstand voltage of the protection diode 21 is defined as $V_D$ Volts, the parasitic resistance of the protection diode 21 is defined as $R_D$ Ω, and the maximum current of the standards flowing through the diode 21 is defined as $I_{Rmax}$ Amperes. Thus, the maximum current of $I_{Rmax}$ provides the maximum permissible current of the diode 21.

The device 101 is used for the in-vehicle device, so that the electro static test shown in FIG. 8C, which is generally used for the in-vehicle semiconductor device, is performed. Thus, the maximum current of the standards $I_{Rmax}$ is set to be 76 Amperes. As shown in FIG. 2, the withstand voltage of the MOS transistor 11 is 83 Volts, and the withstand voltage of the protection diode 21 is 55 Volts. In the current-voltage characteristics in FIG. 2, on the basis of the slope of the linear resistance curve of the protection diode 21, the parasitic resistance $R_D$ is 0.3 Ω.

The product of the maximum current of the standards $I_{Rmax}$ and the parasitic resistance $R_D$ in the right side of the formula No. 1 corresponds to the voltage increase of the parasitic resistance when the maximum current of the standards $I_{Rmax}$ flows through the diode 21. Accordingly, the right side of the formula No. 1 provides the applied voltage of the diode 21 when the maximum current of the standards $I_{Rmax}$ flows through the diode 21. The formula No. 1 shows that the withstand voltage $V_T$ of the MOS transistor 11 is set to be higher than the applied voltage of the diode 21.

In the device 101, the withstand voltage $V_T$ of the MOS transistor 11 is set to be 83 Volts. The voltage increase of the parasitic resistance $R_D$ of 0.3Ω is 23 Volts when the maximum current of the standards $I_{Rmax}$ of 76 Amperes flows through the diode 21. The sum of the voltage increase of the parasitic resistance $R_D$ and the withstand voltage $V_D$ of 55 Volts of the protection diode 21 is 78 Volts. Therefore, the withstand voltage $V_T$ of the MOS transistor 11 is set to be higher by 5 Volts than the sum of the voltage increase of the withstand voltage $V_D$. In FIG. 2, the applied voltage of 78 Volts of the diode 21 when the maximum current $I_{Rmax}$ of 76 Amperes flows through the diode 21 is shows as a chain line, and the withstand voltage $V_T$ of 83 Volts of the MOS transistor 11 is shown as a dotted arrow. The withstand voltage $V_T$ of the MOS transistor 11 shown as the dotted arrow in FIG. 2 is higher by 5 Volts than the applied voltage of the diode 21.

Accordingly, when the ESD is applied to the device 101 so that the surge current having the maximum current of 76 Amperes flows through the diode 21 and the diode 21 is broken down, the surge current does not flow into the MOS transistor 11, which is connected in parallel to the diode 21. Thus, the MOS transistor 1 is prevented from breaking down, so that the MOS transistor 11 does not have the negative resistance region in FIG. 2. Accordingly, the MOS transistor 11 is not broken down.

In the diode 21, the second N$^+$ type region 3$b$ is formed to reduce the parasitic resistance of the N type region 3, although the diode 20$a$ shown in FIG. 10B has no second N$^+$ type region 3$b$. Therefore, the parasitic resistance R$_D$ of the diode 21 shown in FIG. 1B is 0.3Ω, which is smaller than the parasitic resistance R$_D$ of 0.5Ω of the diode 20$a$ shown in FIG. 10B. Accordingly, in the semiconductor device 101 having the protection diode 21, a required withstand voltage of the MOS transistor 11, which satisfies the formula No. 1, is reduced, compared with the semiconductor device having the diode 20$a$ without the second N$^+$ type region 3$b$ shown in FIG. 10B.

In the device 101, the maximum current I$_{Rmax}$ in the formula No. 1 is set to 76 Amperes in order to satisfy the electro static test for the in-vehicle semiconductor device. Alternatively, maximum current I$_{Rmax}$ in the formula No. 1 may be set to 45 Amperes in order to satisfy the electro static test determined by the IEC. Further, alternatively, the maximum current I$_{Rmax}$ in the formula No. 1 may be set to 1.3 Amperes in order to satisfy the electro static test for the general consumer semiconductor device.

(Modifications)

FIGS. 4A, 4B, 5A and 5B show semiconductor devices 102-105 according to modifications of the embodiment of the present invention.

In the semiconductor devices 102, 103, each MOS transistor 12, 13 and each protection diode 22, 23 are formed on a semiconductor substrate 1$b$. The semiconductor substrate 1$b$ is a SOI substrate having an embedded insulation film 4 embedded in the SOI substrate. Further, a N$^-$ type SOI layer 5 is formed on the embedded insulation film 4. Further, a N$^+$ type layer 6 is formed in the SOI layer 5 so that the N$^+$ type layer 6 is disposed between the SOI layer 5 and the embedded insulation film 4.

Each MOS transistor 12, 13 and each protection diode 22, 23 are designed to satisfy the formula No. 1. Accordingly, in each transistor 102, 103, even when the ESD is applied to the device 102, 103, and the protection diode 22, 23 is broken down by the surge maximum current I$_{Rmax}$, the surge current does not flow into the MOS transistor 12, 13. Thus, the MOS transistor 12, 13 is prevented from breaking down; and therefore, the MOS transistor 12, 13 does not show the negative resistance region. Accordingly, the MOS transistor 12, 13 is prevented from breaking down.

Figure 4A:
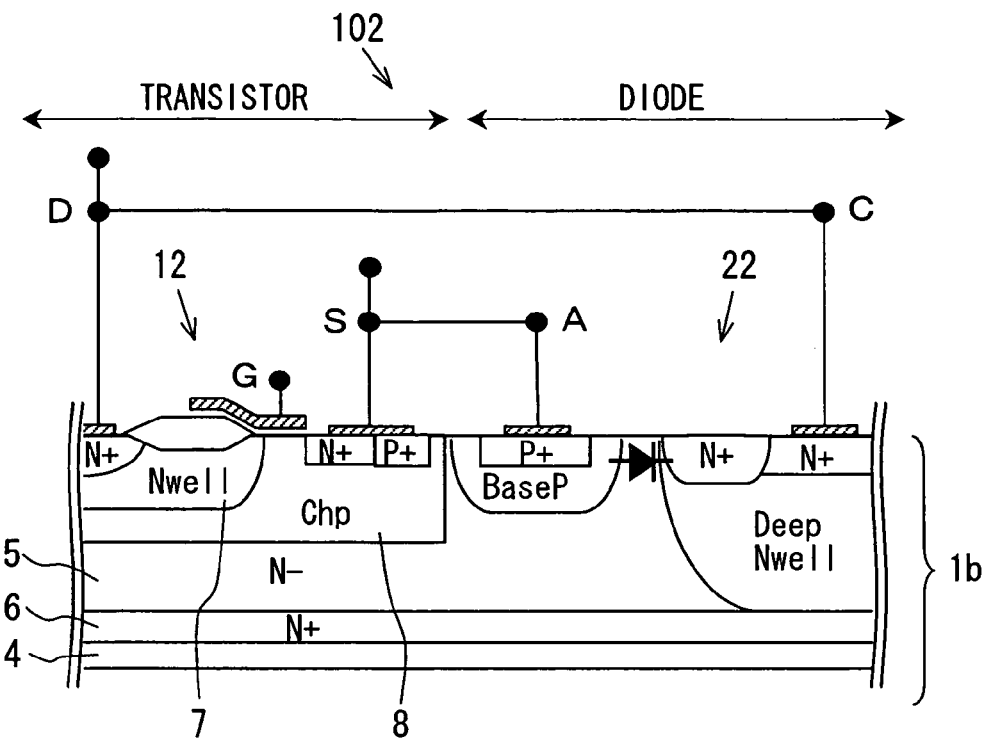
FIGS. 4A and 4B are cross sectional views showing semiconductor devices according to modifications of the embodiment of the present invention.

Here, in general, a MOS transistor in a semiconductor device, which satisfies the formula No. 1, has a comparatively high withstand voltage. This is understood from the MOS transistor 11 in the device 101, for example. The MOS transistor 12 in the device 102 shown in FIG. 4A is a LDMOS transistor, which has different construction different from the transistor 11 in the device 102 shown in FIG. 1B. Specifically, the transistor 12 in the device 102 has a SOI Resurf (i.e., reduced surface field) construction. The Resurf construction of the transistor 12 includes a drain N type region 7 and a channel P type region 8. The drain N type region 7 has a comparative high impurity concentration, and the channel P type region 8 has almost the same impurity concentration as the drain N type region 7. The channel P type region 8 extends to a portion under the drain N type region 7.

When the withstand voltage of a general LDMOS transistor becomes higher, the on-state resistance of the general LDMOS transistor also becomes larger. However, in case of a LDMOS transistor having the Resurf SOI construction such as the MOS transistor 12 shown in FIG. 4A, in general, the increase of the on-state resistance of the LDMOS is suppressed even when the withstand voltage of the LDMOS is high. According to simulation results, for example, when the withstand voltage of the LDMOS transistor 12 having the Resurf SOI construction is 89 Volts, the on-state resistance of the LDMOS is 85 mΩ·mm$^2$. Thus, even when the withstand voltage of the MOS transistor 12 is high, the on-state resistance of the transistor 12 is improved by using the LDMOS transistor 12 having the Resurf SOI construction.

Figure 4B:
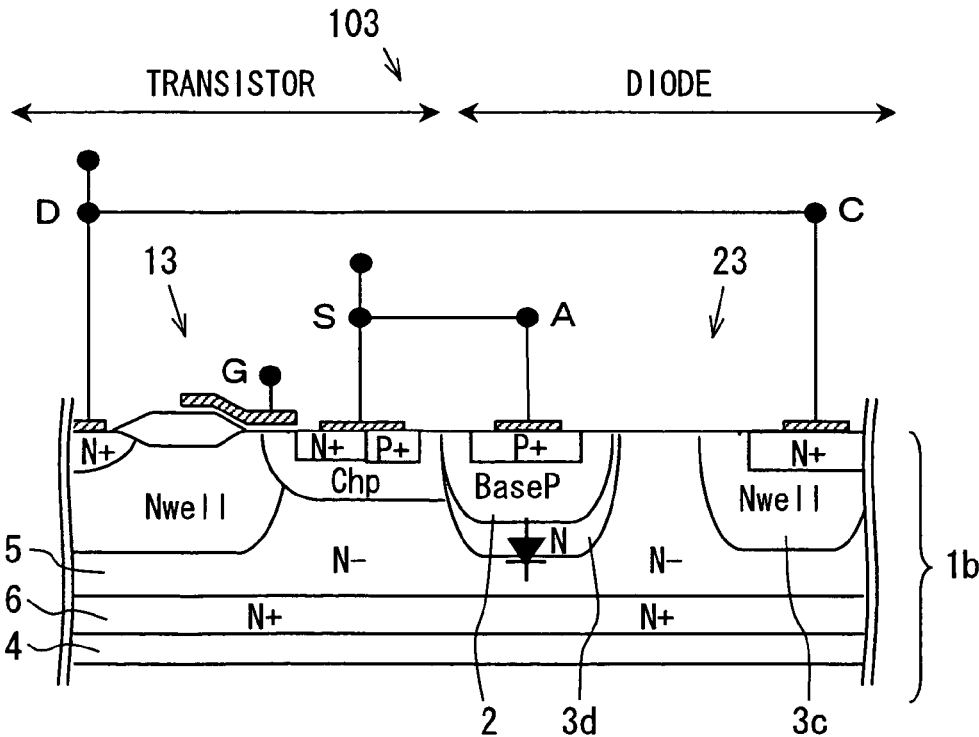

The protection diode 23 in the device 103 shown in FIG. 4B has a different construction different from the diode 21 in the device 101 shown in FIG. 1B. Specifically, in the diode 23 in FIG. 4B, the P type region 2 as the anode A is formed in the second N type region 3$d$. The second N type region 3$d$ is formed on a surface portion of the N$^-$ type semiconductor substrate 1$b$. The second N type region 3$d$ is adjacent to a N type region 3$c$ as the cathode C. Thus, the diode 23 is provided by adding the second N type region 3$d$ under the P type region 2 as the anode A in the diode 21 shown in FIG. 1B.

In the diode 23, the parasitic resistance between the N$^+$ type region 6 and the P type region 2 is reduced by the second N type region 3$d$, and further, the N$^+$ type region 6 disposed on the embedded insulation layer 4 provides a current path of the surge current. Accordingly, the parasitic resistance R$_D$ of the protection diode 23 in the formula No. 1 is reduced, so that the required withstand voltage of the MOS transistor 13 is also reduced.

Figure 5A:
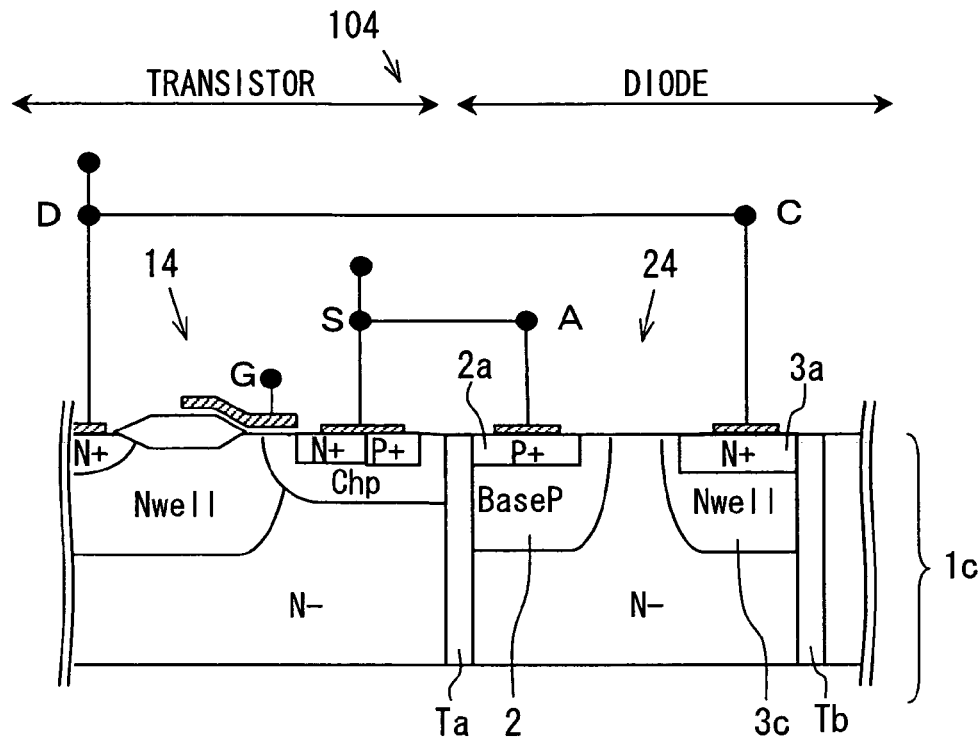
FIGS. 5A and 5B are cross sectional views showing semiconductor devices according to modifications of the embodiment of the present invention.
Figure 5B:
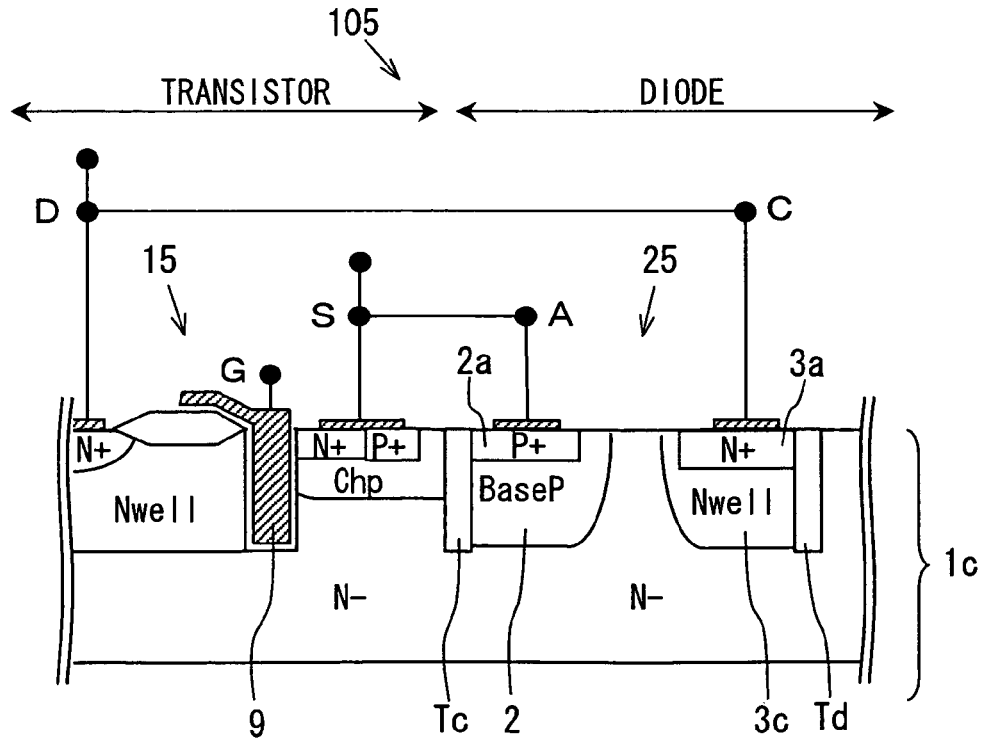

In the devices 104, 105 shown in FIGS. 5A and 5B, each MOS transistor 14, 15 and each protection diode 24, 25 are formed on a semiconductor substrate 1$c$. The substrate 1$c$ has a N$^-$ type surface portion.

Each MOS transistor 14, 15 and each protection diode 24, 25 are designed to satisfy the formula No. 1. Accordingly, in each transistor 104, 105, even when the ESD is applied to the device 104, 105, and the protection diode 24, 25 is broken down by the surge maximum current I$_{Rmax}$, the surge current does not flow into the MOS transistor 14, 15. Thus, the MOS transistor 14, 15 is prevented from breaking down; and therefore, the MOS transistor 14, 15 does not show the negative resistance region. Accordingly, the MOS transistor 14, 15 is prevented from breaking down.

In the diode 24 of the device 104 shown in FIG. 5A, an insulation separation trench Ta is formed such that the trench Ta is disposed opposite to the N type region 3$c$ and adjacent to the P$^+$ type region 2$a$. Another insulation separation trench Tb is formed in the diode 24 such that the trench Tb is disposed opposite to the P type region 2 and adjacent to the first N$^+$ type region 3$a$. The trenches Ta, Tb suppress impurity diffusion from the P type region 2 as the anode A and the N type region 3$c$ as the cathode C in the horizontal direction of the substrate 1$c$ when the thermal diffusion process is performed. Further, at the time of the thermal diffusion process, the depth direction impurity diffusion is promoted. Accordingly, a PN junction area of the protection diode 24 increases, so that the parasitic resistance around the PN junction is reduced. Thus, the parasitic resistance R$_D$ of the diode 24 in the formula No. 1 is reduced, so that the required withstand voltage of the MOS transistor 14 is also reduced. In the diode 24 of the device 104 shown in FIG. 5A, both of the P$^+$ type region 2$a$ and the first N$^+$ type region 3$a$ have the trenches Ta, Tb. Alternatively, only one of the P$^+$ type region 2$a$ and the first N$^+$ type region 3$a$ may have a trench.

In the MOS transistor 15 of the device 105 shown in FIG. 5B, a trench gate 9 is formed. Further, in the diode 25 of the device 105, both of the P$^+$ type region 2$a$ and the first N$^+$ type region 3a have insulation separation trenches Tc, Td. These trenches Tc, Td are formed in a step of forming the trench gate 9. Accordingly, the depth of the trench gate 9 is substantially equal to the depth of each of the trench Tc, Td. In the manufacturing method of the device 105, no additional step for forming the trenches Tc, Td is necessitated. Thus, the manufacturing cost of the device 105 is reduced. Here, in the diode 25, the lateral impurity diffusion from the P type region 2 and the N type region 3c is suppressed by the trenches Tc, Td. Accordingly, the parasitic resistance $R_D$ of the diode 25 is reduced. For example, by forming the trenches Tc, Td, the parasitic resistance $R_D$ of the diode 25 becomes to be 0.3Ω, which is smaller than the parasitic resistance $R_D$ of the diode 25 without forming the trenches Tc, Td, i.e., 0.5Ω.

In the transistor 15 having the trench gate construction, the current flows in a vertical direction of the substrate 1c by using the trench gate 9. Therefore, even when a drift layer has a comparatively low impurity concentration and a long length, the on-state resistance of the device 105 is not largely increased. Specifically, the increase of the on-state resistance of the device 105 is comparatively small. Thus, even when the withstand voltage of the transistor 15 is designed to be comparatively high, the on-state resistance of the device 105 is comparatively small. Accordingly, the transistor 15 has a preferable construction, similar to the transistor 12 having the Resurf SOI construction shown in FIG. 4A. Specifically, the construction of the transistor 15 satisfies the formula No. 1.

Figure 6A:
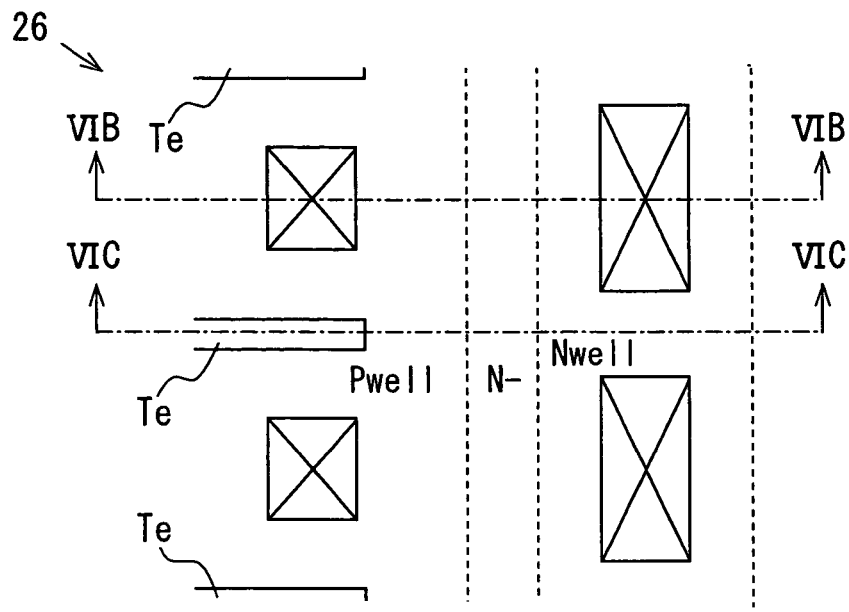
FIG. 6A is a top view showing a semiconductor device according to another modification of the embodiment of the present invention.
Figure 6B:
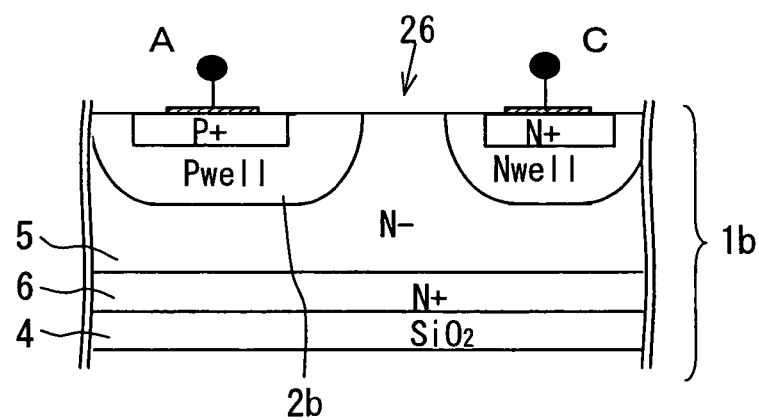
FIG. 6B is a cross sectional view showing the device taken along line VIB-VIB in FIG. 6A.
Figure 6C:
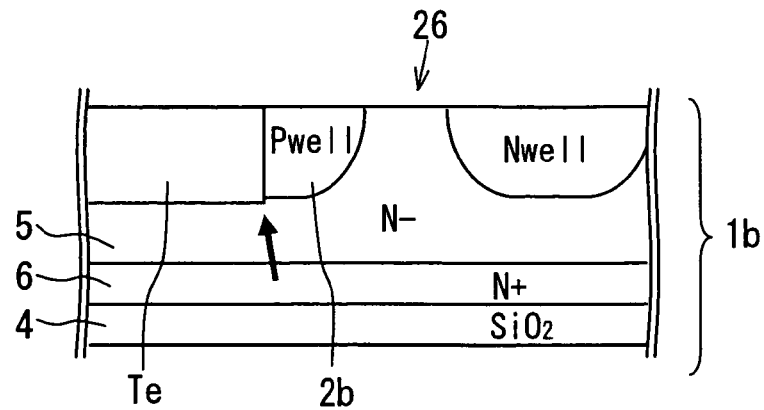
FIG. 6C is a cross sectional view showing the device taken along line VIC-VIC in FIG. 6A.

FIGS. 6A to 6C show a protection diode 26 in a semiconductor device according to another modification of the embodiment of the present invention. The diode 26 is formed on the semiconductor substrate 1b shown in FIGS. 4A and 4B. Specifically, the substrate 1b includes the embedded insulation film 4 and the N⁻ type SOI layer 5, which is disposed on the embedded insulation film 4. Further, in the diode 26, an insulation trench Te having a corner between the P type region 2b and the N⁺ type layer 6 is formed around the anode A. A MOS transistor (not shown) of the device has a trench gate construction, similar to the transistor 15 shown in FIG. 5B. The transistor of the device shown in FIG. 6A is connected in parallel to the diode 26. The trench Te is formed in a step of forming the trench gate.

The break down of the device may be easily occurred by the surge current at the corner of the trench Te, the corner which is disposed between the P type region 2b and the N⁺ type layer 6. The corner of the trench Te is shown as an arrow in FIG. 6C. Thus, the N⁺ type layer 6 on the embedded insulation film 4 also provides the current path of the surge current. In the diode 26, the parasitic resistance $R_D$ of the diode 26 in the formula No. 1 is reduced. Accordingly, the required withstand voltage of the transistor is reduced.

Thus, in a case where the MOS transistor 11-15 and the protection diode 21-26 are formed in the semiconductor substrate 1a-1c, and where the conditions of the device 101-105 satisfies the formula No. 1, the breakdown of the MOS transistor 11-15 is prevented even when the ESD is applied to the device 101-105 so that the protection diode 21-26 is broken down by the surge current. Further, the device 101-105 having the MOS transistor 11-15 and the protection diode 21-26 are designed to satisfy the formula No. 1 so that the device 101-105 is prevented from breaking down even when the diode 21-26 is broken down by the surge current.

The MOS transistor 11-15 and the protection diode 21-26 are individually described in the device 101-105, respectively. Here, the transistor 11-15 has sufficient withstand voltage and small on-state resistance, and the protection diode 21-26 can reduce the parasitic resistance $R_D$. Alternatively, one of constructions of the MOS transistors 11-15 having sufficient withstand voltage and small on-state resistance and one of constructions of the protection diodes 21-26 capable of reducing parasitic resistance $R_D$ may be combined.

The present inventions have the following aspects.

A semiconductor device includes: a MOS transistor having a drain and a source; a protection diode having a cathode and an anode; and a semiconductor substrate. The MOS transistor and the protection diode are disposed in the semiconductor substrate. The drain of the MOS transistor is connected to the cathode of the protection diode. The source of the MOS transistor is connected to the anode of the protection diode. The MOS transistor has a withstand voltage defined as $V_T$. The protection diode has a withstand voltage defined as $V_D$, a parasitic resistance defined as $R_D$, and a maximum current defined as $I_{Rmax}$. The withstand voltage of $V_T$ of the MOS transistor and the withstand voltage of $V_D$, the parasitic resistance of $R_D$, and the maximum current of $I_{Rmax}$ of the protection diode satisfy a relationship of $V_T > V_D + I_{Rmax} \times R_D$. The maximum current of $I_{Rmax}$ of the protection diode is equal to or larger than 45 Amperes.

In this case, the withstand voltage of the MOS transistor defined as $V_T$ is set to be higher than the sum of the withstand voltage of the diode defined as $V_D$ and the voltage increase caused by the parasitic resistance defined as $R_D$ when the maximum current defined as $I_{Rmax}$ flows through the diode. Accordingly, even when the ESD is applied to the device and the protection diode is broken down by the surge current having the maximum current of $I_{Rmax}$, the surge current does not flow through the MOS transistor. Thus, the MOS transistor is prevented from breaking down.

Alternatively, the semiconductor substrate mat have a SOI construction so that the semiconductor substrate includes an embedded insulation film and a N⁻ type SOI layer. The N⁻ type SOI layer is disposed on the embedded insulation film. The semiconductor substrate further includes a N⁺ type layer, which is disposed between the N⁻ type SOI layer and the embedded insulation film. The MOS transistor is a lateral double-diffused MOS transistor having a Resurf construction. In this case, since the MOS transistor is the LDMOS transistor having the Resurf construction, the MOS transistor has a high withstand voltage and low on-state resistance.

Alternatively, the anode of the protection diode may be provided by a P type region disposed in a surface portion of the semiconductor substrate having a N⁻ conductive type. The cathode of the protection diode may be provided by a N type region disposed in the surface portion of the semiconductor substrate. The N type region is disposed adjacent to the P type region. The surface portion of the semiconductor substrate further includes a P⁺ type region and a first N⁺ type region. The P⁺ type region is disposed in the P type region in order to connect to an electrode of the anode. The first N⁺ type region is disposed in the N type region in order to connect to an electrode of the cathode. Alternatively, the surface portion of the semiconductor substrate may further include a second N⁺ type region, and the second N⁺ type region may be disposed in the N type region and disposed between first N⁺ type region and the P⁺ type region. In the above cases, the second N⁺ type region contributes to reduce the parasitic resistance in the N type region. Thus, a required withstand voltage of the MOS transistor is also reduced.

Alternatively, the semiconductor substrate may have a SOI construction so that the semiconductor substrate includes an embedded insulation film and a N⁻ type SOI layer. The N⁻ type SOI layer is disposed on the embedded insulation film. The semiconductor substrate further includes a N⁺ type layer, which is disposed between the N⁻ type SOI layer and the embedded insulation film. The surface portion of the semiconductor substrate further includes a second N type region. The second N type region is disposed adjacent to the N type region. The P type region is disposed in the second N type region. In this case, the second N type region contributes to reduce the parasitic resistance between the N+ type region and the P type region. Further, the N+ type region disposed on the embedded insulation film is used for a current path of the surge current. Accordingly, the parasitic resistance is much reduced, and the required withstand voltage of the MOS transistor is also reduced.

Alternatively, the device may further include: an insulation separation trench, which is disposed adjacent to the P$^+$ type region and opposite to the N type region, and/or disposed adjacent to the first N$^+$ type region and opposite to the P type region. In this case, the insulation separation trench suppresses the lateral direction thermal diffusion from the P type region as the anode and/or the N type region as the cathode. Further, depth direction thermal diffusion is promoted. Thus, the PN junction area of the protection diode is increased, so that the parasitic resistance around the PN junction is reduced. Accordingly, the required withstand voltage of the MOS transistor is also reduced.

Alternatively, the device may further include: an insulation separation trench having a corner. The semiconductor substrate has a SOI construction so that the semiconductor substrate includes an embedded insulation film and a N$^-$ type SOI layer. The N$^-$ type SOI layer is disposed on the embedded insulation film. The semiconductor substrate further includes a N$^+$ type layer, which is disposed between the N$^-$ type SOI layer and the embedded insulation film. The corner of the trench is disposed between the P type region and a N$^+$ type layer. The MOS transistor has a trench gate construction. The insulation separation trench is disposed around the anode. In this case, the break down caused by the surge current may be easily occurred at the corner of the trench between the P type region and the N$^+$ type layer, so that the N$^+$ type layer on the embedded insulation film provides the current path of the surge current. Thus, the required withstand voltage of the MOS transistor is also reduced.

A method for designing a semiconductor device is provided. The semiconductor device includes a MOS transistor having a drain and a source; a protection diode having a cathode and an anode; and a semiconductor substrate. The MOS transistor and the protection diode are disposed in the semiconductor substrate. The drain of the MOS transistor is connected to the cathode of the protection diode. The source of the MOS transistor is connected to the anode of the protection diode. The method comprising the step of: setting a withstand voltage of the MOS transistor and a withstand voltage, a parasitic resistance and a maximum current of the protection diode to satisfy a relationship of $V_T>V_D+I_{Rmax}\times R_D$. The withstand voltage of the MOS transistor is defined as $V_T$. The withstand voltage of the protection diode is defined as $V_D$, the parasitic resistance of the protection diode is defined as $R_D$, and the maximum current of the protection diode is defined as $I_{Rmax}$.

In this case, the withstand voltage of the MOS transistor defined as $V_T$ is set to be higher than the sum of the withstand voltage of the diode defined as $V_D$ and the voltage increase caused by the parasitic resistance defined as $R_D$ the when the maximum current defined as $I_{Rmax}$ flows through the diode. Accordingly, even when the ESD is applied to the device and the protection diode is broken down by the surge current having the maximum current of $I_{Rmax}$, the surge current does not flow through the MOS transistor. Thus, the MOS transistor is prevented from breaking down.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a MOS transistor having a drain and a source;
a protection diode having a cathode and an anode; and
a semiconductor substrate having a N$^-$ conductive type, wherein
   the MOS transistor and the protection diode are disposed in the semiconductor substrate,
   the drain of the MOS transistor is connected to the cathode of the protection diode,
   the source of the MOS transistor is connected to the anode of the protection diode,
   the anode of the protection diode is provided by a P type region disposed in a surface portion of the semiconductor substrate having a N$^-$ conductive type,
   the cathode of the protection diode is provided by a N type region disposed in the surface portion of the semiconductor substrate having a N$^-$ conductive type,
   the N type region is disposed adjacent to the P type region,
   the surface portion of the semiconductor substrate having a N$^-$ conductive type further includes a P$^+$ type region and a first N$^+$ type region,
   the P$^+$ type region is disposed in the P type region in order to connect to an electrode of the anode,
   the first N$^+$ type region is disposed in the N type region in order to connect to an electrode of the cathode,
   the semiconductor substrate having an N$^-$ conductive type has an SOI construction so that the semiconductor substrate includes an embedded insulation film and an N$^-$ type SOI layer,
   the N$^-$ type SOI layer is disposed on the embedded insulation film,
   the semiconductor substrate further includes a N$^+$ type layer, which is disposed between the N$^-$ type SOI layer and the embedded insulation film,
   the surface portion of the semiconductor substrate having an N$^-$ conductive type further includes a second N type region,
   the second N type region is disposed adjacent to the N type region, and
   the P type region is disposed in the second N type region,
   the MOS transistor has a withstand voltage defined as $V_T$,
   the protection diode has a withstand voltage defined as $V_D$, a parasitic resistance defined as $R_D$, and a maximum current defined as $I_{Rmax}$,
   the withstand voltage of $V_T$ of the MOS transistor and the withstand voltage of $V_D$, the parasitic resistance of $R_D$, and the maximum current of $I_{Rmax}$ of the protection diode satisfy a relationship of $V_T>V_D+I_{Rmax}\times R_D$, and
   the maximum current of $I_{Rmax}$ of the protection diode is equal to or larger than 45 Amperes.

2. The device according to claim 1, wherein
the semiconductor device is an in-vehicle semiconductor device, and the maximum current of $I_{Rmax}$ of the protection diode is equal to or larger than 76 Amperes.

3. A method for designing a semiconductor device, wherein the semiconductor device includes a MOS transistor having a drain and a source;

a protection diode having a cathode and an anode; and a semiconductor substrate having an N⁻ conductive type, wherein the MOS transistor and the protection diode are disposed in the semiconductor substrate, wherein the drain of the MOS transistor is connected to the cathode of the protection diode, and wherein the source of the MOS transistor is connected to the anode of the protection diode, the anode of the protection diode is provided by a P type region disposed in a surface portion of the semiconductor substrate having a N⁻ conductive type, the cathode of the protection diode is provided by a N⁻ type region disposed in the surface portion of the semiconductor substrate having a N⁻ conductive type, the N type region is disposed adjacent to the P type region, the surface portion of the semiconductor substrate having a N⁻ conductive type further includes a P⁺ type region and a first N⁺ type region, the P⁺ type region is disposed in the P type region in order to connect to an electrode of the anode, the first N⁺ type region is disposed in the N type region in order to connect to an electrode of the cathode, the semiconductor substrate having an N⁻ conductive type has an SOI construction so that the semiconductor substrate includes an embedded insulation film and an N⁻ type SOI layer, the N⁻ type SOI layer is disposed on the embedded insulation film, the semiconductor substrate further includes a N⁺ type layer, which is disposed between the N⁻ type SOI layer and the embedded insulation film, the surface portion of the semiconductor substrate having an N⁻ conductive type further includes a second N type region, the second N type region is disposed adjacent to the N type region, and the P type region is disposed in the second N type region, the method comprising the step of:

setting a withstand voltage of the MOS transistor and a withstand voltage of the protection diode, a parasitic resistance and a maximum current of the protection diode to satisfy a relationship of $V_T > V_D + I_{Rmax} \times R_D$, wherein the withstand voltage of the MOS transistor is defined as $V_T$, and the withstand voltage of the protection diode is defined as $V_D$, the parasitic resistance of the protection diode is defined as $R_D$, and the maximum current of the protection diode is defined as $I_{Rmax}$ wherein the maximum current of $I_{Rmax}$ of the protection diode is equal to or larger than 45 Amperes.

4. The method according to claim 3, wherein the semiconductor device is an in-vehicle semiconductor device, and the maximum current of $I_{Rmax}$ of the protection diode is equal to or larger than 76 Amperes.

* * * * *